(12) United States Patent
Chang et al.

(10) Patent No.: US 9,659,937 B2
(45) Date of Patent: May 23, 2017

(54) SEMICONDUCTOR PROCESS OF FORMING METAL GATES WITH DIFFERENT THRESHOLD VOLTAGES AND SEMICONDUCTOR STRUCTURE THEREOF

(71) Applicant: UNITED MICROELECTRONICS CORP., Hsin-Chu (TW)

(72) Inventors: Ching-Yun Chang, Yunlin County (TW); Chi-Mao Hsu, Tainan (TW); Wei-Ming Hsiao, Miaoli County (TW); Nien-Ting Ho, Tainan (TW); Kuo-Chih Lai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/683,128

(22) Filed: Apr. 9, 2015

(65) Prior Publication Data
US 2016/0268259 A1     Sep. 15, 2016

(30) Foreign Application Priority Data

Mar. 10, 2015 (TW) .............................. 104107634 A

(51) Int. Cl.
*H01L 27/092* (2006.01)
*H01L 29/49* (2006.01)
(Continued)

(52) U.S. Cl.
CPC .... *H01L 27/0922* (2013.01); *H01L 21/28088* (2013.01); *H01L 21/82345* (2013.01); *H01L 29/4966* (2013.01)

(58) Field of Classification Search
CPC combination set(s) only.
See application file for complete search history.

(56) References Cited

U.S. PATENT DOCUMENTS

2010/0216287 A1* 8/2010 Tsai ................ H01L 21/31144
                                                    438/199
2010/0314687 A1* 12/2010 Xu ................... H01L 21/28088
                                                    257/369

(Continued)

OTHER PUBLICATIONS

Yang, Title of Invention: Semiconductor Device and Method for Fabricating the Same, U.S. Appl. No. 14/543,387, filed Dec. 1, 2014.

(Continued)

*Primary Examiner* — Kyoung Lee
*Assistant Examiner* — Ratisha Mehta
(74) *Attorney, Agent, or Firm* — Winston Hsu; Scott Margo

(57) ABSTRACT

A semiconductor process of forming metal gates with different threshold voltages includes the following steps. A substrate having a first area and a second area is provided. A dielectric layer and a first work function layer are sequentially formed on the substrate of the first area and the second area. A second work function layer is directly formed on the first work function layer of the first area. A third work function layer is directly formed on the first work function layer of the second area, where the third work function layer is different from the second work function layer. The present invention also provides a semiconductor structure formed by said semiconductor process.

20 Claims, 5 Drawing Sheets

(51) Int. Cl.
*H01L 21/28* (2006.01)
*H01L 21/8234* (2006.01)

(56) References Cited

U.S. PATENT DOCUMENTS

| | | | |
|---|---|---|---|
| 2010/0327364 A1 | 12/2010 | Tsuchiya | |
| 2012/0286376 A1* | 11/2012 | Hung | H01L 29/772 257/412 |
| 2013/0026579 A1* | 1/2013 | Lu | H01L 27/1104 257/369 |
| 2013/0087859 A1* | 4/2013 | Liang | H01L 27/092 257/369 |
| 2013/0154012 A1* | 6/2013 | Fu | H01L 21/28088 257/368 |
| 2013/0200467 A1* | 8/2013 | Edge | H01L 21/82345 257/392 |
| 2014/0363964 A1* | 12/2014 | Breil | H01L 29/42372 438/595 |
| 2015/0021694 A1* | 1/2015 | Trevino | H01L 21/82382 257/368 |
| 2015/0270177 A1* | 9/2015 | Tseng | H01L 21/823857 438/216 |

OTHER PUBLICATIONS

Yang, Title of Invention: Semiconductor Device and Method for Fabricating the Same, U.S. Appl. No. 14/543,914, filed Nov. 18, 2014.

* cited by examiner

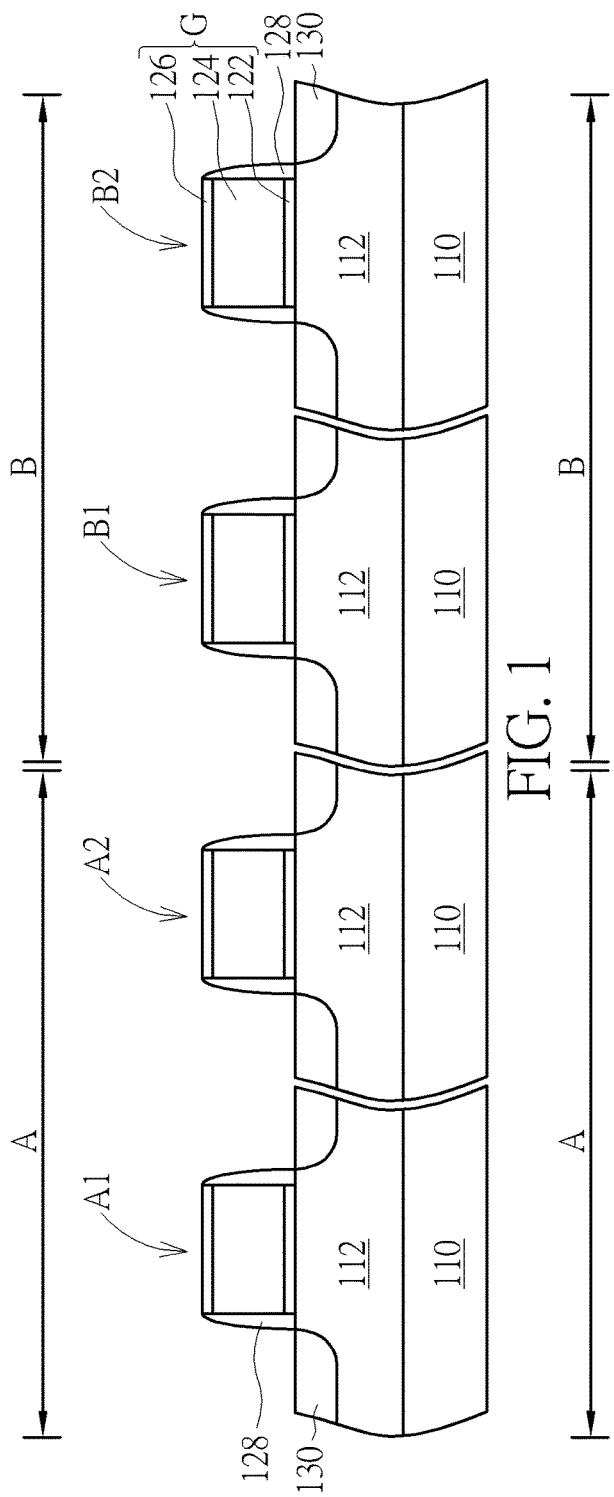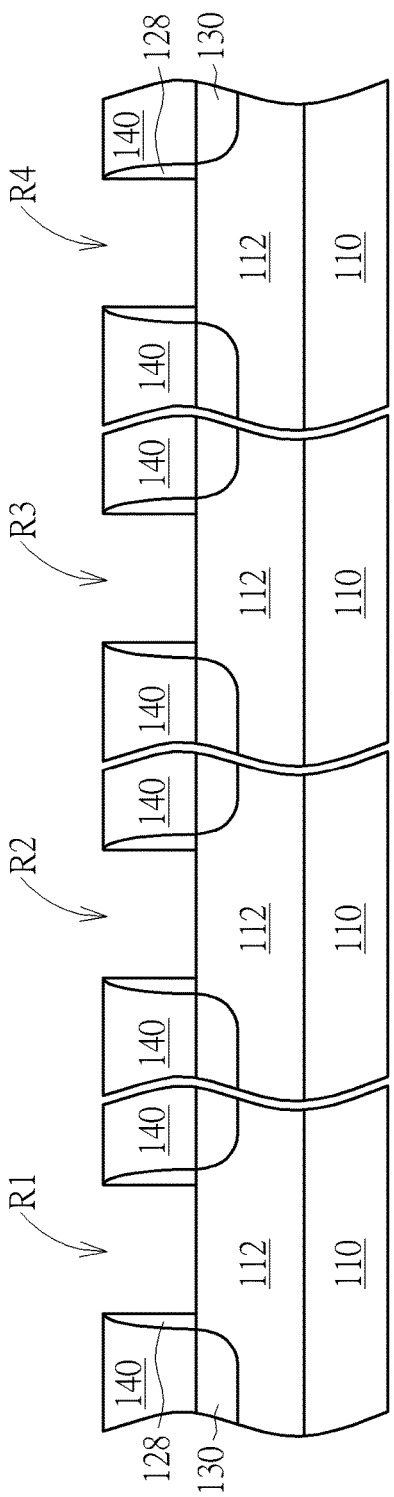

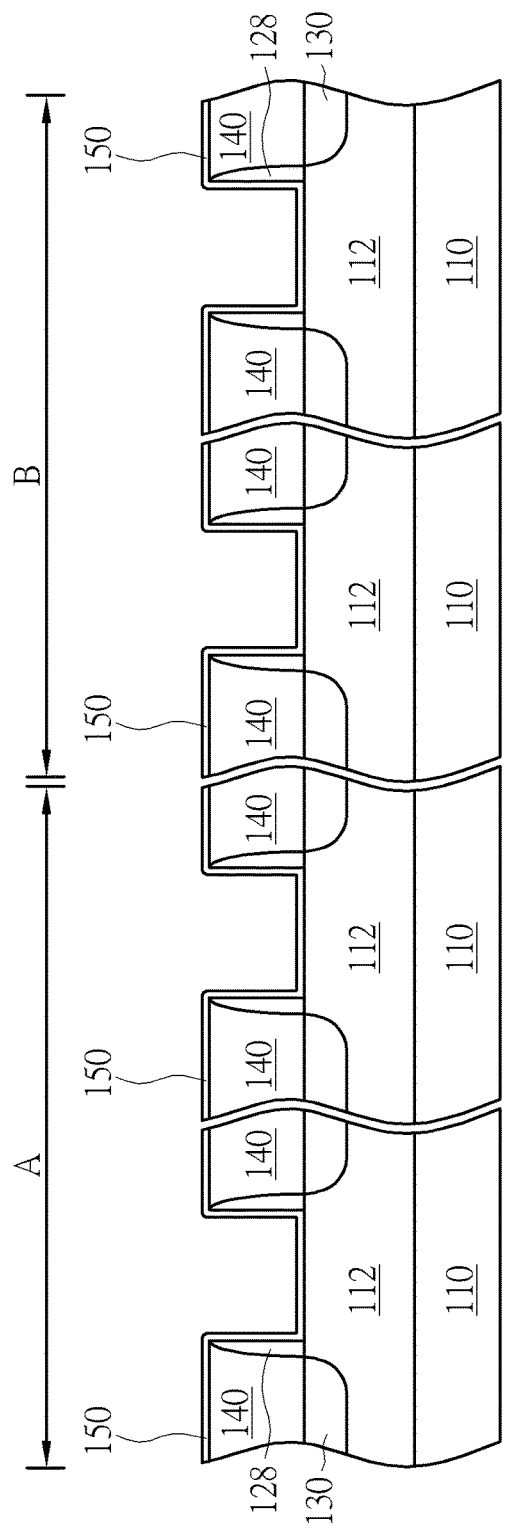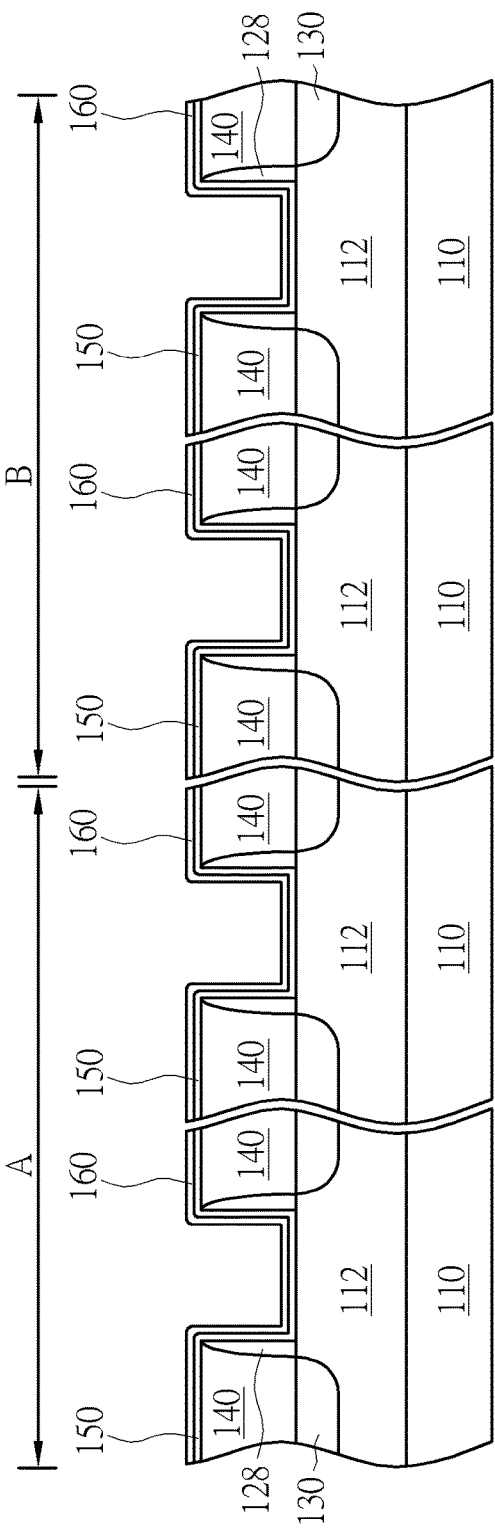

SEMICONDUCTOR PROCESS OF FORMING METAL GATES WITH DIFFERENT THRESHOLD VOLTAGES AND SEMICONDUCTOR STRUCTURE THEREOF

BACKGROUND OF THE INVENTION

1. Field of the Invention

The present invention relates generally to a semiconductor process of forming metal gates with different threshold voltages and semiconductor structure thereof, and more specifically to a semiconductor process of forming metal gates with different threshold voltages by applying stacked work function layers and semiconductor structure thereof.

2. Description of the Prior Art

Poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effect. This increases equivalent thickness of the gate dielectric layer, reduces gate capacitance, and worsens a driving force of the devices. Therefore, work function metals that are suitable for use as the high-K gate dielectric layer are used to replace the conventional poly-silicon gate to be the control electrode.

SUMMARY OF THE INVENTION

The present invention provides a semiconductor process of forming metal gates with different threshold voltages and semiconductor structure thereof, which forms metal gates with different threshold voltages by forming different work function layers respectively on a same work function layer.

The present invention provides a semiconductor process of forming metal gates with different threshold voltages including the following step. A substrate has a first area and a second area. A dielectric layer and a first work function layer are sequentially formed on the substrate of the first area and the second area. A second work function layer is formed directly on the first work function layer of the first area. A third work function layer is formed directly on the first work function layer of the second area, wherein the third work function layer is different from the second work function layer.

The present invention provides a semiconductor structure including a substrate, a first gate and a second gate. The substrate has a first area and a second area. The first gate is disposed on the substrate of the first area, wherein the first gate includes a dielectric layer, a first work function layer and a second work function layer stacked from bottom to top. The second gate is disposed on the substrate of the second area, wherein the second gate includes the dielectric layer, the first work function layer and a third work function layer stacked from bottom to top, wherein the third work function layer is different from the second work function layer.

According to the above, the present invention provides a semiconductor process of forming metal gates with different threshold voltages and semiconductor structure thereof, which forms different work function layers such as the second work function layer and the third work function layer on a same work function layer such as the first work function layer, to solve the substrate effect and form metal gates having different threshold voltages.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 schematically depict cross-sectional views of a semiconductor process of forming metal gates with different threshold voltages according to an embodiment of the present invention.

DETAILED DESCRIPTION

Figure 5:
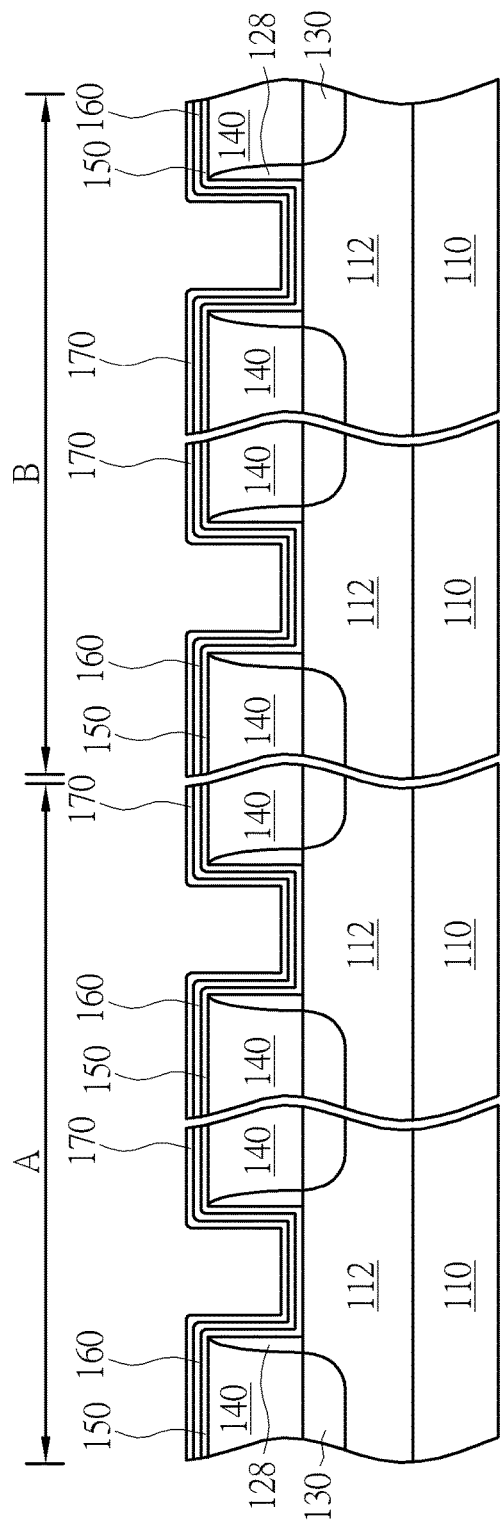

FIGS. 1-9 schematically depict cross-sectional views of a semiconductor process of forming metal gates with different threshold voltages according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The substrate 110 has a first area A and a second area B. The first area A is an NMOS transistor area while the second area B is a PMOS transistor area, wherein the first area A and the second area B are supposed to have metal gates with different threshold voltages formed in later processes, but it is not limited thereto. More precisely, an N-type transistor with a medium low threshold voltage (mLVT) A1 and an N-type transistor with a standard threshold voltage (SVT) A2 are supposed to be formed in the first area A, and a P-type transistor with a standard threshold voltage (SVT) B1 and a P-type transistor with a medium low threshold voltage (mLVT) B2 are supposed to be formed in the second area B, but it is not limited thereto. In some embodiments, three or more than three transistors with different threshold voltages may be formed in the first area A and the second area B respectively. For example, an N-type transistor with a medium low threshold voltage (mLVT), an N-type transistor with a low threshold voltage (LVT) and an N-type transistor with a standard threshold voltage (SVT) may be formed in the first area A, and a P-type transistor with a standard threshold voltage (SVT), a P-type transistor with a low threshold voltage (LVT) and a P-type transistor with a medium low threshold voltage (mLVT) may be formed in the second area B.

At least a fin structure 112 and an isolation layer (not shown) are formed in the substrate 110, wherein the bottom part of the fin structure 112 is surrounded by the isolation layer such as silicon oxide to form shallow trench isolation structures. Multi-gate MOSFETs are applied in this embodiment, so that transistors are formed on the fin structure 112, but the present invention is not limited thereto. The present invention may also be applied to planar transistors or other semiconductor structures, depending upon practical requirements.

Methods of forming the fin structure 112 may include, but are not limited to, the following. A bulk bottom substrate (not shown) is provided. A hard mask layer (not shown) is formed on the bulk bottom substrate (not shown) and is patterned to define the location of the fin structure 112, which will be formed in the bulk bottom substrate (not shown). An etching process is performed to form the fin structure 112 in the bulk bottom substrate (not shown). Thus, the fin structure 112 located in the substrate 110 is formed completely. In one embodiment, the hard mask layer (not shown) is removed after the fin structure 112 is formed, and tri-gate MOSFETs can be formed in the following processes. There are three contact faces between the fin structure 112 and the following formed dielectric layer functioning as a carrier channel whose width is wider than a channel width in a conventional planar MOSFET. When a driving voltage is applied, the tri-gate MOSFET produces a double on-current comparing to the conventional planar MOSFET. In another embodiment, the hard mask layer (not shown) is reserved to form a fin field effect transistor (Fin FET), which is another kind of multi-gate MOSFET. Due to the hard mask layer (not shown) being reserved in the fin field effect transistor, there are only two contact faces between the fin structure 112 and the following formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown) is exposed, meaning a fin structure formed on the silicon-on-insulator substrate (not shown) is finished.

A dielectric layer 122, a sacrificial electrode layer 124 and a cap layer 126 are sequentially formed from bottom to top and disposed across the fin structure 112 and the substrate 110, thereby dummy gates G being formed, which will be replaced by metal gates through a replacement metal gate (RMG) process. The method of forming the dielectric layer 122, the sacrificial electrode layer 124 and the cap layer 126 may include: a dielectric layer (not shown), a sacrificial electrode layer (not shown) and a cap layer (not shown) are blanketly formed and patterned. A gate-last for high-k last process is applied in this embodiment. Thus, the dielectric layer 122 will be removed in later processes and then a gate dielectric layer having a high dielectric constant is formed. Therefore, the material of the dielectric layer 122 may be just a sacrificial material suitable for being removed in later processes, which may be an oxide layer, formed by a thermal oxide process or a chemical oxide process, but it is not limited thereto. In other embodiments, the present invention may also be applied in a gate-last for high-k first process, a gate-first process or a polysilicon process etc. The sacrificial electrode layer 124 may be a polysilicon layer; the cap layer 126 may be a single layer or a dual layer composed of a nitride layer or an oxide layer etc, for serving as a patterned hard mask, but it is not limited thereto. Spacers 128 may be formed on the substrate 110 and the fin structure 112 beside the dummy gates G. Each of the spacers 128 may be a single layer structure or a dual layer structure composed of silicon nitride or silicon oxide etc.

A source/drain 130 is formed in the fin structure 112 beside each of the spacers 128 by performing processes such as a suitable ion implantation process in each transistor respectively. Moreover, before/after the spacers 128 and the source/drains 130 are formed, an offset (not shown) may be formed on the substrate 110 and the fin structure 112 beside each of the dummy gates G; and then, a lightly doped source/drain may be formed in the fin structure 112 beside each of the offsets by performing processes such as a suitable lightly doped ion implantation process respectively. An epitaxy process may be performed before/after/while the spacers 128 and the source/drains 130 are formed to form an epitaxial structure (not shown) in the fin structure 112 beside each of the spacers 128 respectively. Therefore, the lightly doped source/drain, the source/drain 130 and the epitaxial structure in each transistor may be partially or entirely overlapped.

A dielectric material may be formed and planarized to form an inter-level dielectric layer 140 on the substrate 110 and the fin structure 112 beside the spacers 128, as shown in FIG. 2. The dummy gates G in the first area A and the second area B may be removed simultaneously, and thus recesses R1/R2/R3/R4 in the first area A and the second area B are formed, as shown in FIG. 2. Hence, metal gates can be formed in the recesses R1/R2/R3/R4 in later processes.

As shown in FIG. 3, a buffer layer (not shown) may be optionally formed in each of the recesses R1/R2/R3/R4. A dielectric layer 150 may be formed to cover the recesses R1/R2/R3/R4 and the inter-level dielectric layer 140. The buffer layer may be an oxide layer, which may be formed by a thermal oxide process or a chemical oxide process, but it is not limited thereto. The buffer layer is located between the dielectric layer 150 and the substrate 110 to buffer the dielectric layer 150 and the substrate 110. A gate-last for high-k last process is applied in this embodiment, so that the dielectric layer 150 has a U-shaped cross-sectional profile and is a gate dielectric layer having a high dielectric constant, which may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_1$-$xO_3$, PZT) and barium strontium titanate ($Ba_xSr_1$-$xTiO_3$, BST), but it is not limited thereto.

As shown in FIG. 4, a bottom barrier layer 160 may be optionally formed to cover the dielectric layer 150 of the first area A and the second area B simultaneously. The bottom barrier layer 160 may be composed of tantalum nitride (TaN), but it is not limited thereto. In another embodiment, the bottom barrier layer 160 may be composed of titanium nitride (TiN) or others.

As shown in FIG. 5, a first work function layer 170 may be formed to cover the bottom barrier layer 160 of the first area A and the second area B simultaneously. The first work function layer 170 may be composed of titanium nitride (TiN), tantalum nitride (TaN), tantalum carbide (TaC) or others. In this embodiment, the first work function layer 170 is a P-type work function layer, but it is not limited thereto.

Figure 6:
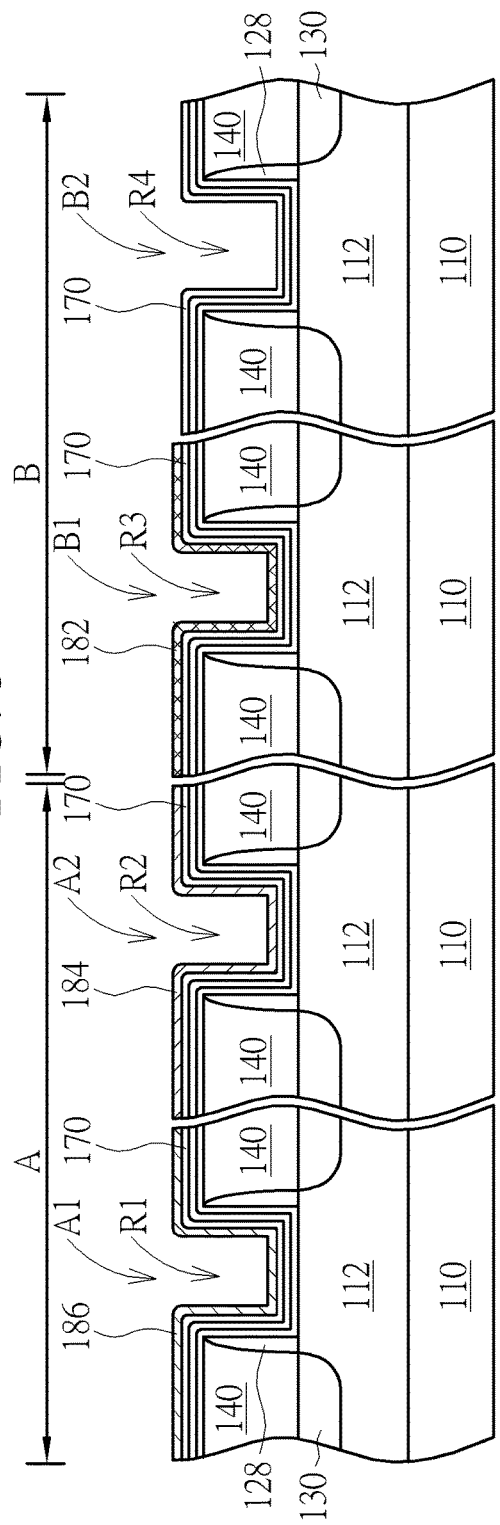

As shown in FIG. 6, a second work function layer 182, a third work function layer 184 and a fourth work function layer 186 may be formed respectively on the first work function layer 170 of the second area B and the first area A. More precisely, there is no work function layer on the first work function layer 170 in the P-type transistor with a medium low threshold voltage (mLVT) B2. The second work function layer 182 is only formed on and directly contacts the first work function layer 170 of the P-type transistor with a standard threshold voltage (SVT) B1. The third work function layer 184 is only formed on and directly contacts the first work function layer 170 of the N-type transistor with a standard threshold voltage (SVT) A2. The fourth work function layer 186 is only formed on and directly contacts the first work function layer 170 of the N-type transistor with a medium low threshold voltage (mLVT) A1. It is emphasized that, the present invention applies different work function layers in different areas but on the same work function layer. This means the second work function layer 182, the third work function layer 184 and the fourth work function layer 186 are respectively formed on the same first work function layer 170 but respectively in the P-type transistor with a standard threshold voltage (SVT) B1, the N-type transistor with a standard threshold voltage (SVT) A2 and the N-type transistor with a medium low threshold voltage (mLVT) A1. In this embodiment, there are only the N-type transistor with a medium low threshold voltage (mLVT) A1, the N-type transistor with a standard threshold voltage (SVT) A2, the P-type transistor with a standard threshold voltage (SVT) B1 and the P-type transistor with a medium low threshold voltage (mLVT) B2 depicted, but the present invention is not restricted thereto.

The second work function layer 182, the third work function layer 184 and the fourth work function layer 186 must be different work function layers, which may have different materials, thicknesses or chemical bondings, thereby having different work function values. It is noted that, due to different work function layers such as the second work function layer 182, the third work function layer 184 and the fourth work function layer 186 being formed on the same work function layer such as the first work function layer 170, thus the substrate effect can being solved. As a layer is formed on different bottom layers, thicknesses or chemical bondings etc of the formed layer in different bottom layers will be different, leading to physical properties such as work function values or chemical properties of the formed layers hard to be controlled. By applying different work function layers on the same work function layer, especially on the work function layer having a same surface condition, the present invention can solve said problems.

In the present invention, the first work function layer 170 may be a P-type work function layer while the second work function layer 182, the third work function layer 184 and the fourth work function layer 186 may be N-type work function layers, to adjust work function values of each transistor. For instance, the first work function layer 170 may be composed of titanium nitride (TiN), tantalum nitride (TaN) or tantalum carbide (TaC) etc; the second work function layer 182, the third work function layer 184 and the fourth work function layer 186 may be composed of binary composition metals or ternary composition metals such as titanium aluminide (TiAl), zirconium aluminide (ZrAl), tungsten aluminide (WAl), tantalum aluminide (TaAl), hafnium aluminide (HfAl), titanium aluminum carbide (TiAlC), titanium aluminum nitride (TiAlN), titanium silicon nitride (TiSiN) or tungsten nitride (WN), but it is not limited thereto.

In one case, the second work function layer 182, the third work function layer 184 and the fourth work function layer 186 are N-type work function layers with different materials to respectively tune the N-type transistor with a medium low threshold voltage (mLVT) A1, the N-type transistor with a standard threshold voltage (SVT) A2, the P-type transistor with a standard threshold voltage (SVT) B1 and the P-type transistor with a medium low threshold voltage (mLVT) B2, so that transistors with different work function values can be formed. The second work function layer 182, the third work function layer 184 and the fourth work function layer 186 may be formed by photolithography and etching processes, such that performing deposition processes such as atomic layer deposition (ALD) processes or chemical vapor deposition (CVD) processes and then etching processes to respectively form these work function layers in each area, but it is not limited thereto.

In another case, the second work function layer 182, the third work function layer 184 and the fourth work function layer 186 may be aluminum containing layers with different aluminum concentrations, so that the N-type work function values of the second work function layer 182, the third work function layer 184 and the fourth work function layer 186 may be controlled by adjusting aluminum concentrations. The aluminum concentrations of the second work function layer 182, the third work function layer 184 and the fourth work function layer 186 may be different as-deposited. Thereby, the second work function layer 182, the third work function layer 184 and the fourth work function layer 186 may be formed by photolithography and etching processes, such that performing deposition processes such as atomic layer deposition (ALD) processes or chemical vapor deposition (CVD) processes and then etching processes to respectively form these work function layers in each area, but it is not limited thereto. In addition, the second work function layer 182, the third work function layer 184 and the fourth work function layer 186 may be formed as common layers, and then the second work function layer 182, the third work function layer 184 and the fourth work function layer 186 are doped with different aluminum concentrations, depending upon practical requirements.

In another case, the second work function layer 182, the third work function layer 184 and the fourth work function layer 186 may have common materials but different thicknesses. Thereby, the second work function layer 182, the third work function layer 184 and the fourth work function layer 186 may be formed by atomic layer deposition (ALD) processes with different depositing cycles; or, the second work function layer 182, the third work function layer 184 and the fourth work function layer 186 may be formed by depositing and then individually etching, but it is not limited thereto.

In another embodiment, the second work function layer 182, the third work function layer 184 and the fourth work function layer 186 may have common materials but different processing temperatures. Therefore, the second work function layer 182, the third work function layer 184 and the fourth work function layer 186 can have different chemical bondings, and thus having different N-type work function values.

Preferably, the second work function layer 182, the third work function layer 184 and the fourth work function layer 186 of the present invention all are single layers having different materials, aluminum concentrations, thicknesses, chemical bondings or others to tune work function values in each transistor. Hence, the single work function layers can increase openings apertures of the recesses R1/R2/R3/R4 while performing replacement metal gate (RMG) processes, enabling gap filling of conductive materials easier.

Figure 7:
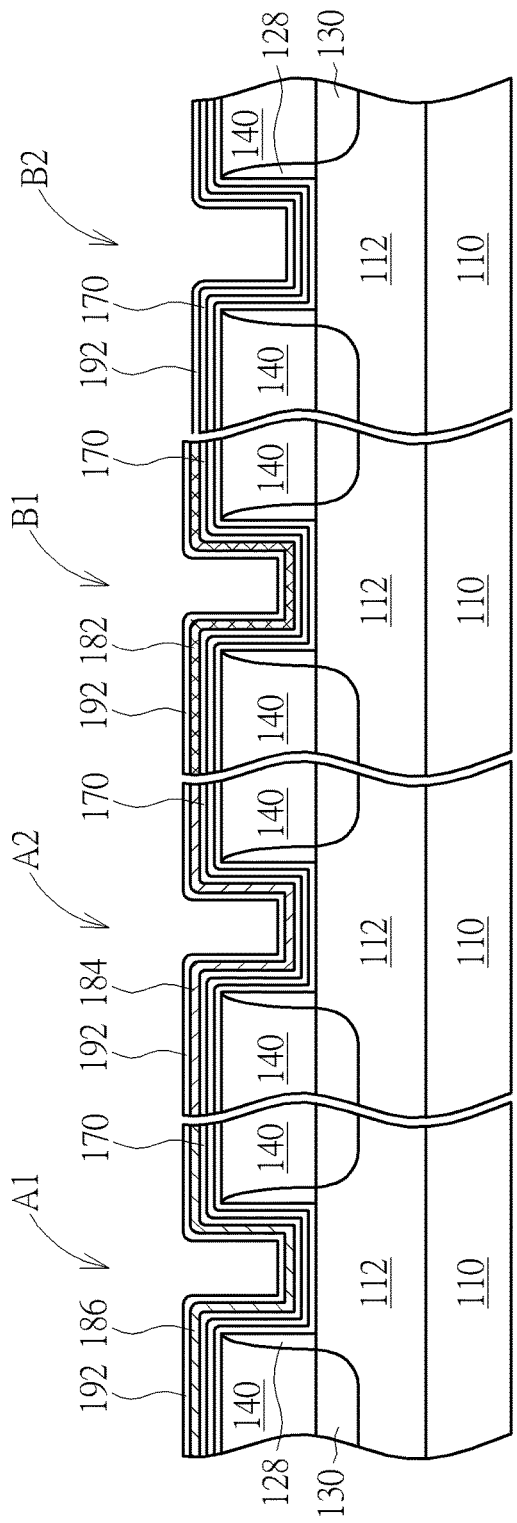

As shown in FIG. 7, a top barrier layer 192 may be formed on and directly contacts the first work function layer 170 of the P-type transistor with a medium low threshold voltage (mLVT) B2, the second work function layer 182 of the P-type transistor with a standard threshold voltage (SVT) B1, the third work function layer 184 of the N-type transistor with a standard threshold voltage (SVT) A2 and the fourth work function layer 186 of the N-type transistor with a medium low threshold voltage (mLVT) A1 respectively. The top barrier layer 192 may be composed of titanium nitride (TiN), tantalum nitride (TaN) or others.

Figure 8:
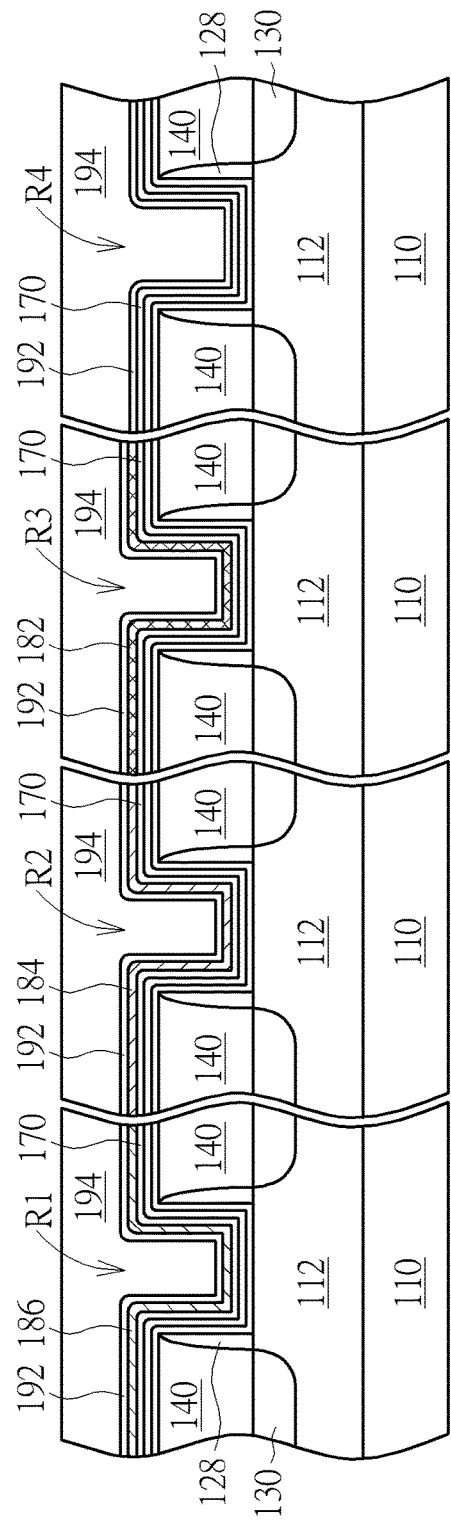
Figure 9:
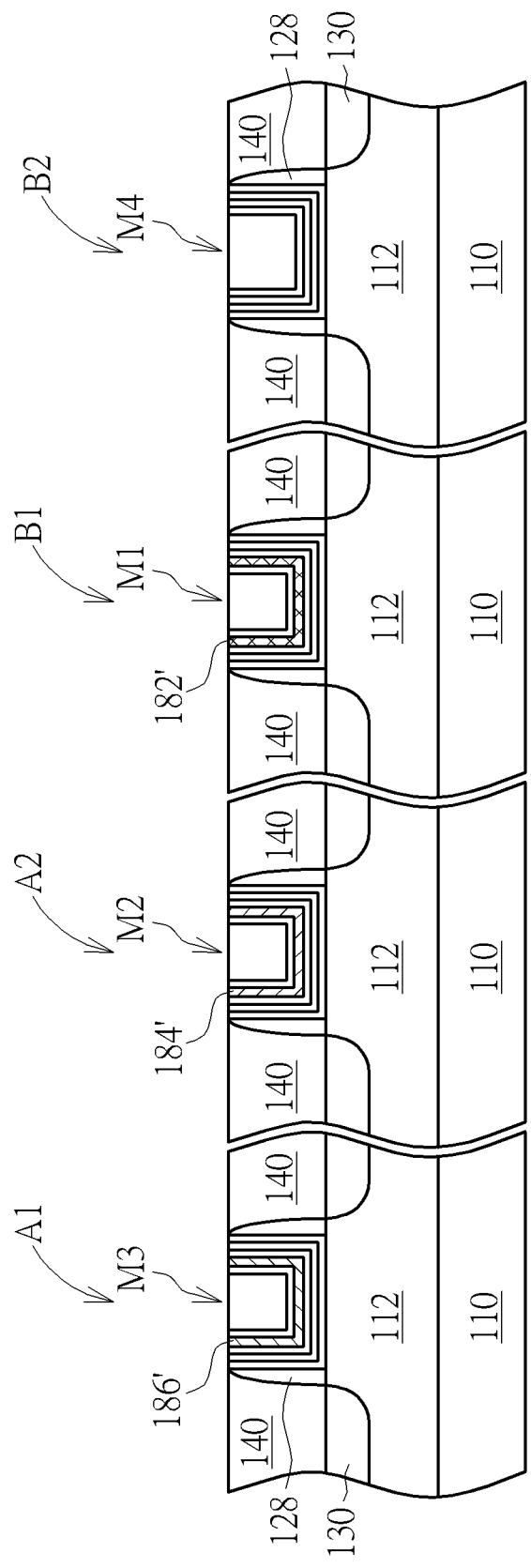

In FIG. 8 filling a main conductive material 194 into the recesses R1/R2/R3/R4 and covering the top barrier layer 192 is shown. The main conductive material 194 may be low resistivity materials such as aluminum, tungsten, titanium aluminum alloy, cobalt tungsten phosphide (CoWP) or others. The main conductive material 194 and its below material layers may then be planarized until the inter-level dielectric layer 140 is exposed, thereby a first gate M1, a second gate M2, a third gate M3 and a fourth gate M4 may be formed, as shown in FIG. 9, wherein the third gate M3 of the N-type transistor with a medium low threshold voltage (mLVT) A1 has a fourth work function layer 186', the second gate M2 of the N-type transistor with a standard threshold voltage (SVT) A2 has a third work function layer 184', the first gate M1 of the P-type transistor with a standard threshold voltage (SVT) B1 has a second work function layer 182' and the fourth gate M4 of the P-type transistor with a medium low threshold voltage (mLVT) B2 only has the first work function layer 170. Besides, the second work function layer 182', the third work function layer 184' and the fourth work function layer 186' are different material layers, thereby the first gate M1, the second gate M2, the third gate M3 and the fourth gate M4 have different work function values.

To summarize, the present invention provides a semiconductor process of forming metal gates with different threshold voltages and semiconductor structure thereof, which forms different work function layers such as the second work function layer, the third work function layer and the fourth work function layer on a same work function layer such as the first work function layer, especially on a same work function layer having a same surface condition, to solve the substrate effect and form metal gates having different threshold voltages. In one case, the first work function layer is a P-type work function layer while the second work function layer, the third work function layer and the fourth work function layer are N-type work function layers, therefore P-type transistors and N-type transistors can be formed through tuning work function values of the second work function layer, the third work function layer and the fourth work function layer. The first work function layer may be a P-type material layer composed of titanium nitride (TiN), tantalum nitride (TaN), tantalum carbide (TaC) or others; the second work function layer, the third work function layer and the fourth work function layer may be N-type material layers composed of binary composition metals or ternary composition metals such as titanium aluminide (TiAl), zirconium aluminide (ZrAl), tungsten aluminide (WAl), tantalum aluminide (TaAl), hafnium aluminide (HfAl), titanium aluminum carbide (TiAlC), titanium aluminum nitride (TiAlN), titanium silicon nitride (TiSiN), tungsten nitride (WN) or others.

Moreover, the second work function layer, the third work function layer and the fourth work function layer must be different to have different work function values, wherein the second work function layer, the third work function layer and the fourth work function layer may have different materials, thicknesses, chemical bondings, etc. The second work function layer, the third work function layer and the fourth work function layer may be formed by atomic layer deposition (ALD) processes or chemical vapor deposition (CVD) processes etc; the second work function layer, the third work function layer and the fourth work function layer may be formed by deposition processes, enabling these work function layers having different aluminum concentrations as-deposited or through doped; the second work function layer, the third work function layer and the fourth work function layer may be formed by atomic layer deposition (ALD) processes with different depositing cycles; or the second work function layer, the third work function layer and the fourth work function layer may be formed by deposition processes having common depositing materials but different processing temperatures, depending upon practical requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process of forming metal gates with different threshold voltages, comprising:
    providing a substrate, having a first area and a second area;
    sequentially forming a dielectric layer, a bottom barrier layer and a first work function layer on the substrate of the first area and the second area;
    forming a second work function layer directly on the first work function layer of the first area;
    forming a third work function layer only in the second area and directly on the first work function layer of the second area, wherein the third work function layer is different from the second work function layer; and
    forming a main conductive material on the second work function layer of the first area as well as on the third work function layer of the second area.

2. The semiconductor process of forming metal gates with different threshold voltages according to claim 1, wherein the material of the third work function layer is different from the material of the second work function layer.

3. The semiconductor process of forming metal gates with different threshold voltages according to claim 2, wherein the first work function layer comprises a P-type work function layer while the second work function layer and the third work function layer comprise N-type work function layers.

4. The semiconductor process of forming metal gates with different threshold voltages according to claim 1, wherein the first work function layer comprises titanium nitride (TiN), tantalum nitride (TaN) or tantalum carbide (TaC).

5. The semiconductor process of forming metal gates with different threshold voltages according to claim 1, wherein the second work function layer and the third work function layer comprise binary composition metals or ternary composition metals.

6. The semiconductor process of forming metal gates with different threshold voltages according to claim 5, wherein the second work function layer and the third work function layer comprise titanium aluminide (TiAl), zirconium aluminide (ZrAl), tungsten aluminide (WAl), tantalum aluminide (TaAl), hafnium aluminide (HfAl), titanium aluminum carbide (TiAlC), titanium aluminum nitride (TiAlN), titanium silicon nitride (TiSiN) or tungsten nitride (WN).

7. The semiconductor process of forming metal gates with different threshold voltages according to claim 1, wherein the second work function layer and the third work function layer are aluminum containing layers with different aluminum concentrations.

8. The semiconductor process of forming metal gates with different threshold voltages according to claim 1, wherein the second work function layer and the third work function layer have common materials but different thicknesses.

9. The semiconductor process of forming metal gates with different threshold voltages according to claim 1, wherein the second work function layer and the third work function layer are formed by atomic layer deposition (ALD) processes.

10. The semiconductor process of forming metal gates with different threshold voltages according to claim 9, wherein the second work function layer and the third work function layer are formed by atomic layer deposition (ALD) processes with different depositing cycles.

11. The semiconductor process of forming metal gates with different threshold voltages according to claim 1, wherein the second work function layer and the third work function layer have common materials but different processing temperatures.

12. The semiconductor process of forming metal gates with different threshold voltages according to claim 1, wherein the second work function layer and the third work function layer are both single material layers.

13. The semiconductor process of forming metal gates with different threshold voltages according to claim 1, further comprising:
   forming a top barrier layer on the second work function layer and the third work function layer respectively after the second work function layer and the third work function layer are formed.

14. A semiconductor structure, comprising:
   a substrate having a first area and a second area;
   a first gate disposed on the substrate of the first area, wherein the first gate comprises a dielectric layer, a first work function layer, a second work function layer and a main conductive material stacked from bottom to top; and
   a second gate disposed on the substrate of the second are, wherein the second gate comprises the dielectric layer, the first work function layer, a third work function layer and the main conductive material stacked from bottom to top, wherein the third work function layer is different from the second work function layer, the second work function layer is only in the first area, and the third work function layer is only in the second area, and the second work function layer and the third work function layer have same conductive type.

15. The semiconductor structure according to claim 14, wherein a surface of the first work function layer of the first area and a surface of the first work function layer of the second area have a same surface condition.

16. The semiconductor structure according to claim 14, wherein the material of the third work function layer is different from the material of the second work function layer.

17. The semiconductor structure according to claim 14, wherein the first work function layer comprises a work function layer of a PMOS transistor while the second work function layer and the third work function layer comprise work function layers of NMOS transistors.

18. The semiconductor structure according to claim 14, wherein the second work function layer and the third work function layer are aluminum containing layers with different aluminum concentrations.

19. The semiconductor structure according to claim 14, wherein the second work function layer and the third work function layer have common materials but different thicknesses.

20. The semiconductor structure according to claim 14, wherein the second work function layer and the third work function layer are both single material layers.

* * * * *